United States Patent
Lin et al.

(10) Patent No.: US 10,763,292 B2
(45) Date of Patent: Sep. 1, 2020

(54) INTERCONNECT APPARATUS AND METHOD FOR A STACKED SEMICONDUCTOR DEVICE

(71) Applicant: Taiwan Semiconductor Manufacturing Company, Ltd., Hsinchu (TW)

(72) Inventors: Jeng-Shyan Lin, Tainan (TW); Shu-Ting Tsai, Kaohsiung (TW); Dun-Nian Yaung, Taipei (TW); Jen-Cheng Liu, Hsinchu (TW); Feng-Chi Hung, Chu-Bei (TW); Shih-Pei Chou, Tainan (TW); Min-Feng Kao, Chiayi (TW); Szu-Ying Chen, Toufen Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/224,300

(22) Filed: Dec. 18, 2018

(65) Prior Publication Data

US 2019/0148435 A1 May 16, 2019

Related U.S. Application Data

(60) Continuation of application No. 15/395,360, filed on Dec. 30, 2016, now Pat. No. 10,163,956, which is a
(Continued)

(51) Int. Cl.
*H01L 27/146* (2006.01)
*H01L 21/768* (2006.01)
(Continued)

(52) U.S. Cl.
CPC ...... *H01L 27/14634* (2013.01); *H01L 21/768* (2013.01); *H01L 21/76898* (2013.01);
(Continued)

(58) Field of Classification Search
CPC ........... H01L 27/14634; H01L 27/1469; H01L 27/1464; H01L 24/09; H01L 23/528;
(Continued)

(56) References Cited

U.S. PATENT DOCUMENTS

| | | |
|---|---|---|
| 5,098,856 A | 3/1992 | Beyer et al. |
| 6,867,073 B1 | 3/2005 | Enquist |

(Continued)

FOREIGN PATENT DOCUMENTS

| | | |
|---|---|---|
| CN | 1947236 A | 4/2007 |
| CN | 101091243 A | 12/2007 |

*Primary Examiner* — Steven H Loke
*Assistant Examiner* — Juanita B Rhodes
(74) *Attorney, Agent, or Firm* — Slater Matsil, LLP

(57) ABSTRACT

A method includes bonding a first semiconductor chip on a second semiconductor chip, applying an etching process to the first semiconductor chip and the second semiconductor chip until a metal surface of the second semiconductor chip is exposed, wherein as a result of applying the etching process, an opening is formed in the first semiconductor chip and the second semiconductor chip and plating a conductive material in the opening to from a conductive plug.

20 Claims, 16 Drawing Sheets

Related U.S. Application Data division of application No. 13/890,841, filed on May 9, 2013, now Pat. No. 9,536,777.

(60) Provisional application No. 61/780,465, filed on Mar. 13, 2013.

(51) Int. Cl.
*H01L 23/00* (2006.01)
*H01L 25/00* (2006.01)
*H01L 23/48* (2006.01)
*H01L 25/065* (2006.01)
*H01L 23/522* (2006.01)
*H01L 23/528* (2006.01)
*H01L 21/306* (2006.01)
*H01L 23/532* (2006.01)

(52) U.S. Cl.
CPC .......... *H01L 23/481* (2013.01); *H01L 23/528* (2013.01); *H01L 23/5226* (2013.01); *H01L 24/09* (2013.01); *H01L 24/80* (2013.01); *H01L 25/0657* (2013.01); *H01L 25/50* (2013.01); *H01L 27/1464* (2013.01); *H01L 27/1469* (2013.01); *H01L 27/14636* (2013.01); *H01L 21/30625* (2013.01); *H01L 21/76805* (2013.01); *H01L 23/53214* (2013.01); *H01L 23/53228* (2013.01); *H01L 24/92* (2013.01); *H01L 2224/08146* (2013.01); *H01L 2224/80894* (2013.01); *H01L 2224/80895* (2013.01); *H01L 2224/80896* (2013.01); *H01L 2224/9202* (2013.01); *H01L 2224/9212* (2013.01); *H01L 2224/94* (2013.01); *H01L 2225/06524* (2013.01); *H01L 2225/06541* (2013.01); *H01L 2225/06565* (2013.01); *H01L 2924/01322* (2013.01); *H01L 2924/12036* (2013.01); *H01L 2924/12043* (2013.01); *H01L 2924/13056* (2013.01); *H01L 2924/1431* (2013.01)

(58) Field of Classification Search
CPC ........... H01L 23/5226; H01L 21/76898; H01L 25/50; H01L 24/80; H01L 25/0657; H01L 23/481; H01L 23/53228; H01L 23/53214; H01L 21/30625; H01L 2224/9212; H01L 21/76805; H01L 2924/12043; H01L 2924/01322; H01L 2224/80894; H01L 2225/06565; H01L 2225/06541; H01L 2924/1431; H01L 2224/94; H01L 2224/9202; H01L 2224/80896; H01L 24/92; H01L 2224/08146; H01L 2224/80895; H01L 2225/06524; H01L 2924/13056; H01L 2224/80001; H01L 2224/82; H01L 2224/8203; H01L 2224/821; H01L 2924/00; H01L 2924/12036; H01L 2224/80

See application file for complete search history.

(56) References Cited

U.S. PATENT DOCUMENTS

| | | | |
|---|---|---|---|
| 6,949,461 | B2 | 9/2005 | Malhotra et al. |
| 8,563,403 | B1* | 10/2013 | Farooq .............. H01L 21/76898 438/459 |
| 2007/0096263 | A1 | 5/2007 | Furukawa et al. |
| 2009/0014891 | A1* | 1/2009 | Chang ................. H01L 21/6835 257/777 |
| 2009/0042365 | A1* | 2/2009 | McDonald ........ H01L 21/76898 438/459 |
| 2010/0264551 | A1* | 10/2010 | Farooq .............. H01L 21/76898 257/777 |
| 2011/0133339 | A1* | 6/2011 | Wang ................ H01L 21/76898 257/773 |
| 2011/0171582 | A1 | 7/2011 | Farooq et al. |
| 2011/0171827 | A1* | 7/2011 | Farooq ................ H01L 21/0337 438/653 |
| 2011/0304024 | A1 | 12/2011 | Renna |
| 2011/0306197 | A1* | 12/2011 | Kim ....................... H01L 28/82 438/593 |
| 2012/0248624 | A1 | 10/2012 | Endo |
| 2013/0264688 | A1 | 10/2013 | Qian et al. |
| 2014/0175653 | A1* | 6/2014 | Sandhu ............. H01L 21/76816 257/754 |
| 2014/0232013 | A1* | 8/2014 | Wu ....................... H01L 23/481 257/775 |
| 2014/0264862 | A1 | 9/2014 | Tsai et al. |

* cited by examiner

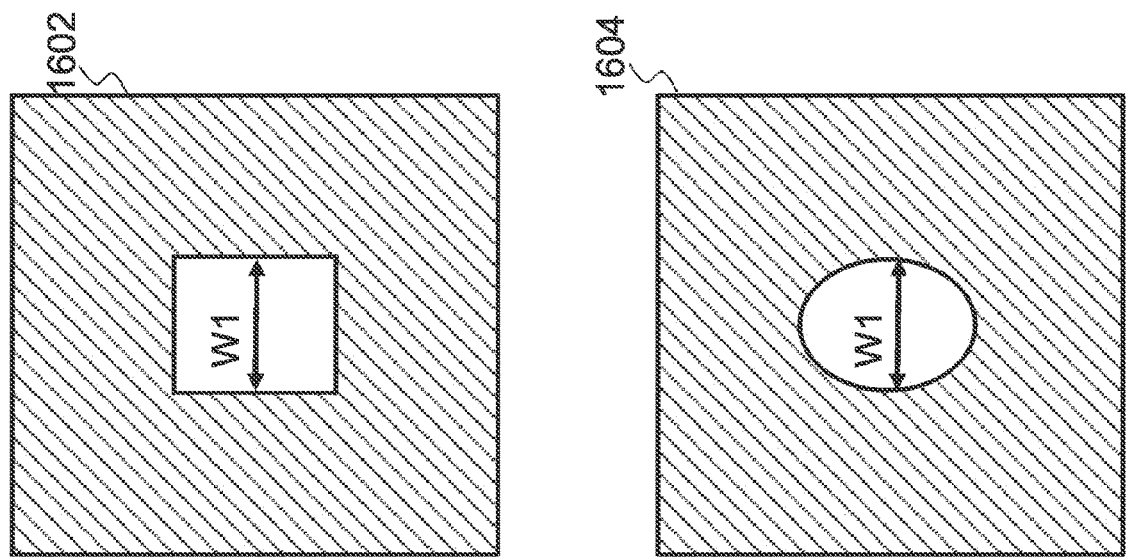
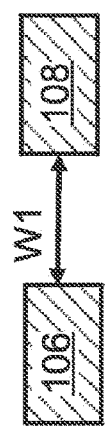
Figure 16

INTERCONNECT APPARATUS AND METHOD FOR A STACKED SEMICONDUCTOR DEVICE

PRIORITY CLAIM AND CROSS-REFERENCE

This is a continuation application of U.S. application Ser. No. 15/395,360, entitled "Interconnect Apparatus and Method" which was filed on Dec. 30, 2016 which is a divisional application of U.S. application Ser. No. 13/890,841, entitled "Interconnect Apparatus and Method" which was filed on May 9, 2013 and issued as U.S. Pat. No. 9,536,777 on Jan. 3, 2017, which claims priority to U.S. Provisional Application Ser. No. 61/780,465, entitled "Interconnect Apparatus and Method" which was filed on Mar. 13, 2013, all of which are incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrink the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed on top of one another to further reduce the form factor of the semiconductor device.

Two semiconductor wafers may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. Once two semiconductor wafers are bonded together, the interface between two semiconductor wafers may provide an electrically conductive path between the stacked semiconductor wafers.

One advantageous feature of stacked semiconductor devices is much higher density can be achieved by employing stacked semiconductor devices. Furthermore, stacked semiconductor devices can achieve smaller form factors, cost-effectiveness, increased performance and lower power consumption.

BRIEF DESCRIPTION OF THE DRAWINGS

For a more complete understanding of the present invention, and the advantages thereof, reference is now made to the following descriptions taken in conjunction with the accompanying drawings, in which:

FIG. 16 illustrates another top view of the hard mask in accordance with various embodiments of the present disclosure.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a method for forming interconnect structures for a stacked semiconductor device. The invention may also be applied, however, to a variety of semiconductor devices. Hereinafter, various embodiments will be explained in detail with reference to the accompanying drawings.

Figure 1:
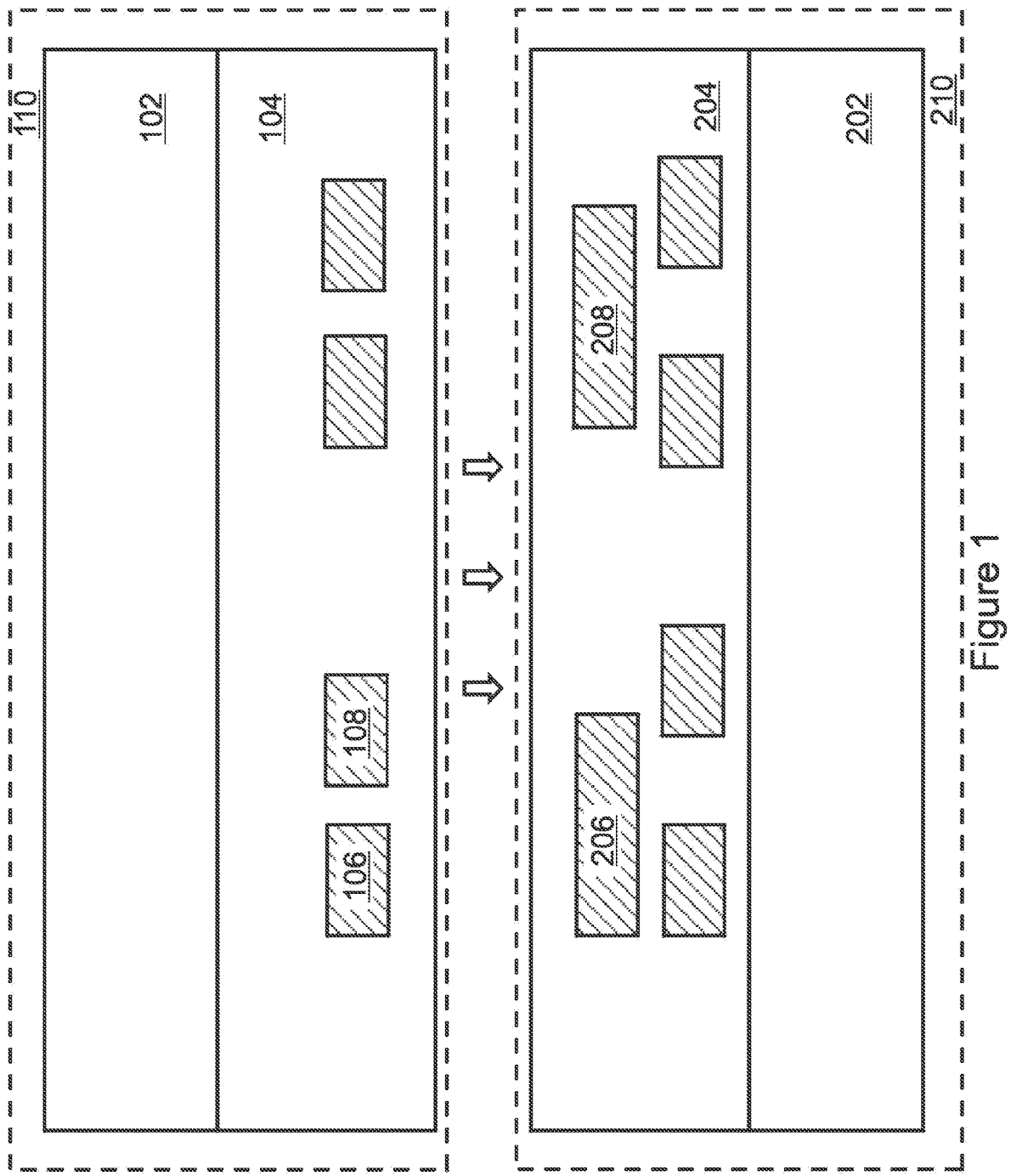
FIG. 1 illustrates a cross sectional view of a stacked semiconductor device prior to a bonding process in accordance with various embodiments of the present disclosure.

FIG. 1 illustrates a cross sectional view of a stacked semiconductor device prior to a bonding process in accordance with various embodiments of the present disclosure. Both the first semiconductor wafer 110 and the second semiconductor wafer 210 include a semiconductor substrate (e.g., first substrate 102 and second substrate 202) and a plurality of interconnect structures (e.g., metal lines 106, 108, 206 and 208) formed over the semiconductor substrate. The first semiconductor wafer 110 is used as an example to illustrate the detailed structure of the semiconductor wafers prior to a bonding process.

As shown in FIG. 1, the first semiconductor wafer 110 may comprises a first substrate 102 and a plurality of inter-metal dielectric layers 104 formed over the first substrate 102. In addition, a plurality of metal lines such as metal lines 106 and 108 are formed in the inter-metal dielectric layers 104.

The first substrate 102 may be formed of silicon, although it may also be formed of other group III, group IV, and/or group V elements, such as silicon, germanium, gallium, arsenic, and combinations thereof. The first substrate 102 may also be in the form of silicon-on-insulator (SOI). The SOI substrate may comprise a layer of a semiconductor material (e.g., silicon, germanium and/or the like) formed over an insulator layer (e.g., buried oxide and/or the like), which is formed in a silicon substrate. In addition, other substrates that may be used include multi-layered substrates, gradient substrates, hybrid orientation substrates, any combinations thereof and/or the like.

The first substrate 102 may further comprise a variety of electrical circuits (not shown). The electrical circuits formed on the first substrate 102 may be any type of circuitry suitable for a particular application. In accordance with some embodiments, the electrical circuits may include various n-type metal-oxide semiconductor (NMOS) and/or p-type metal-oxide semiconductor (PMOS) devices such as transistors, capacitors, resistors, diodes, photo-diodes, fuses and/or the like.

The electrical circuits may be interconnected to perform one or more functions. The functions may include memory structures, processing structures, sensors, amplifiers, power distribution, input/output circuitry and/or the like. One of ordinary skill in the art will appreciate that the above examples are provided for illustrative purposes only and are not intended to limit the various embodiments to any particular applications.

The inter-metal dielectric layers 104 are formed over the first substrate 102. As shown in FIG. 1, the inter-metal dielectric layers 104 may comprise a plurality of metal lines such as metal lines 106 and 108.

The metal lines 106 and 108 may be made through any suitable formation process (e.g., lithography with etching, damascene, dual damascene, or the like) and may be formed using suitable conductive materials such as copper, aluminum, aluminum alloys, copper alloys or the like.

As shown in FIG. 1, the first semiconductor wafer 110 will be stacked on top of the second semiconductor wafer 210. In some embodiments, a plurality of bonding pads are formed in the first semiconductor wafer 110 and the second semiconductor wafer 210 respectively. Furthermore, the bonding pads located at the second semiconductor wafer 210 are aligned face-to-face with their corresponding bonding pads located at the first semiconductor wafer 110. The first semiconductor wafer 110 and the second semiconductor wafer 210 are bonded together through suitable bonding techniques such as direct bonding.

In accordance with some embodiments, in a direct bonding process, the connection between the first semiconductor wafer 110 and the second semiconductor wafer 210 can be implemented through metal-to-metal bonding (e.g., copper-to-copper bonding), dielectric-to-dielectric bonding (e.g., oxide-to-oxide bonding), metal-to-dielectric bonding (e.g., oxide-to-copper bonding), any combinations thereof and/or the like.

It should be noted that the bonding show in FIG. 1 may be at wafer level. In the wafer-level bonding, wafers 110 and 210 are bonded together, and are then sawed into dies. Alternatively, the bonding may be performed at the chip level.

It should further be noted that the first semiconductor wafer 110 may be a backside illumination sensor and the second semiconductor wafer 210 may be a logic circuit. The backside illuminated image sensor may be formed in an epitaxial layer over a silicon substrate. According to the fabrication process of backside illuminated image sensors, the silicon substrate has been removed in a backside thinning process. A portion of epitaxial layer remains. A photo active region is formed in the remaining epitaxial layer.

The photo active regions may comprise, for example, photo-diodes formed by implanting impurity ions into the epitaxial layer. Furthermore, the photo active regions may be a PN junction photo-diode, a PNP photo-transistor, an NPN photo-transistor or the like. In accordance with an embodiment, the photo active regions may comprise a p-type layer formed on an n-type region, wherein the n-type region is formed on an epitaxial layer grown from a p-type semiconductor substrate.

The second semiconductor wafer 210 may comprise a logic circuit. The logic circuit may be an analog-to-digital converter. In addition, the logic circuit may be a data processing circuit, various embodiments may also include other circuits connected to a backside illuminated image sensor, such as a memory circuit, a bias circuit, a reference circuit and the like.

After the first semiconductor wafer 110 is bonded on the second semiconductor wafer 210, a thinning process may be applied to the backside of the first semiconductor wafer in accordance with an embodiment. According to the fabrication processes of backside illuminated image sensors, the substrate is thinned until the epitaxial layer is exposed. More particularly, the backside the substrate may be thinned to a thickness in a range from about 2 um to about 2.15 um. Such a thin substrate layer allows light to pass through the substrate and hit photo diodes embedded in the substrate without being absorbed by the substrate.

Figure 2:
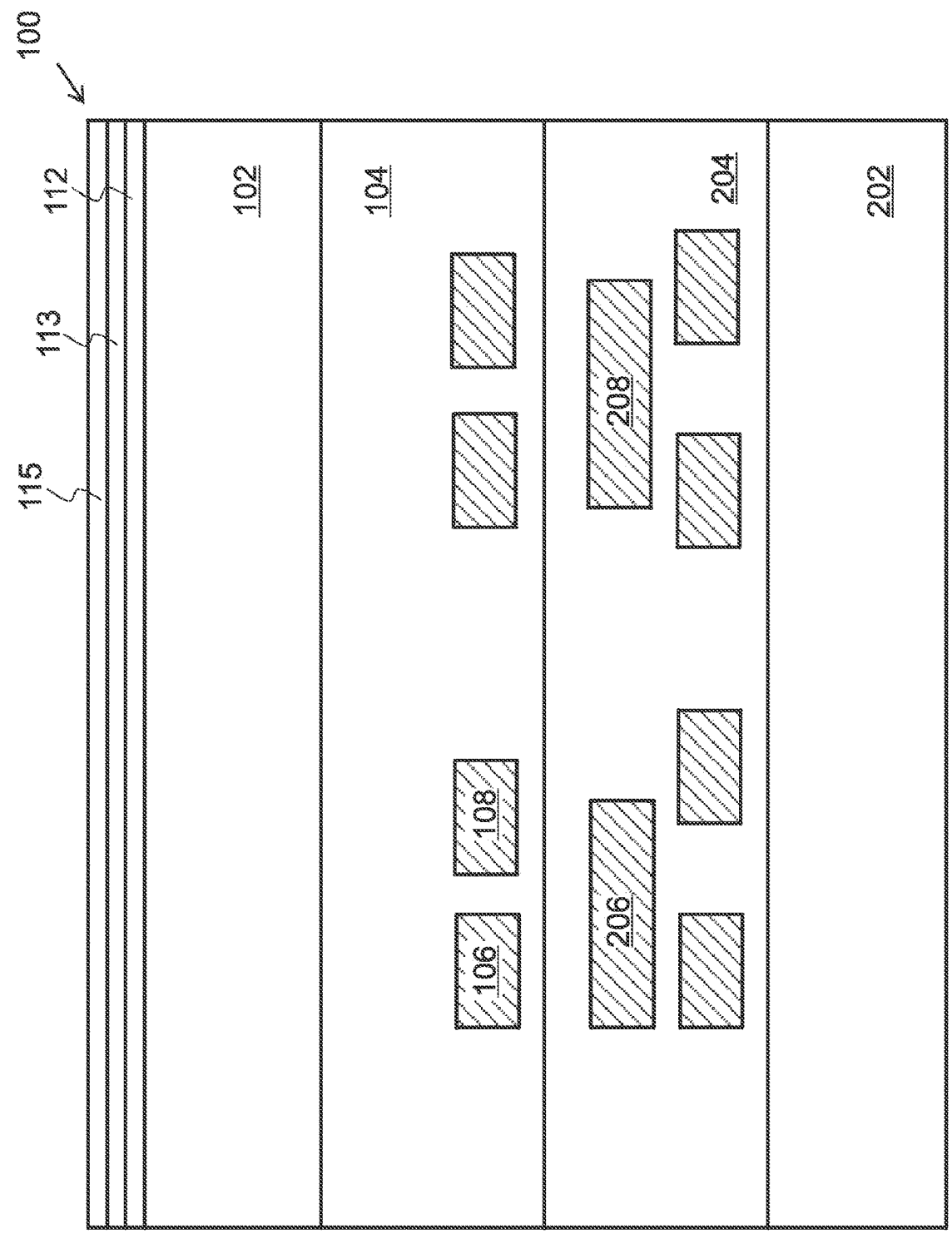
FIG. 2 illustrates a cross sectional view of the semiconductor device shown in FIG. 1 after a bottom anti-reflection coating (BARC) layer and a plurality of hard mask layers are formed over the first semiconductor wafer in accordance with various embodiments of the present disclosure.

The thinning process may be implemented by using suitable techniques such as grinding, polishing and/or chemical etching. In accordance with an embodiment, the thinning process may be implemented by using a chemical mechanical polishing (CMP) process. In a CMP process, a combination of etching materials and abrading materials are put into contact with the back side of the substrate and a grinding pad (not shown) is used to grind away the back side of the substrate until a desired thickness is achieved FIG. 2 illustrates a cross sectional view of the semiconductor device shown in FIG. 1 after a bottom anti-reflection coating (BARC) layer and a plurality of hard mask layers are formed over the first semiconductor wafer in accordance with various embodiments of the present disclosure. The BARC layer 112 is formed on a backside of the first substrate 102. Throughout the description, the side of the first substrate 102 adjacent to the BARC layer 112 is referred to the backside of the first substrate 102.

The BARC layer 112 may be formed of a nitride material, an organic material, an oxide material and the like. The BARC layer 112 may be formed using suitable techniques such as chemical vapor deposition (CVD) and/or the like.

A first hard mask layer 113 is formed over the BARC layer 112. A second hard mask layer 115 is formed over the first hard mask layer 113. In some embodiments, the first hard mask layer 113 may be formed of polysilicon. The second hard mask layer 115 is formed of oxide. Throughout the description, the first hard mask layer 113 is alternatively referred to as a poly hard mask layer 113. The second hard mask layer 115 is alternatively referred to as an oxide hard mask layer 115. The poly and oxide hard mask layers may be formed using suitable techniques such as CVD and/or the like.

Figure 3:
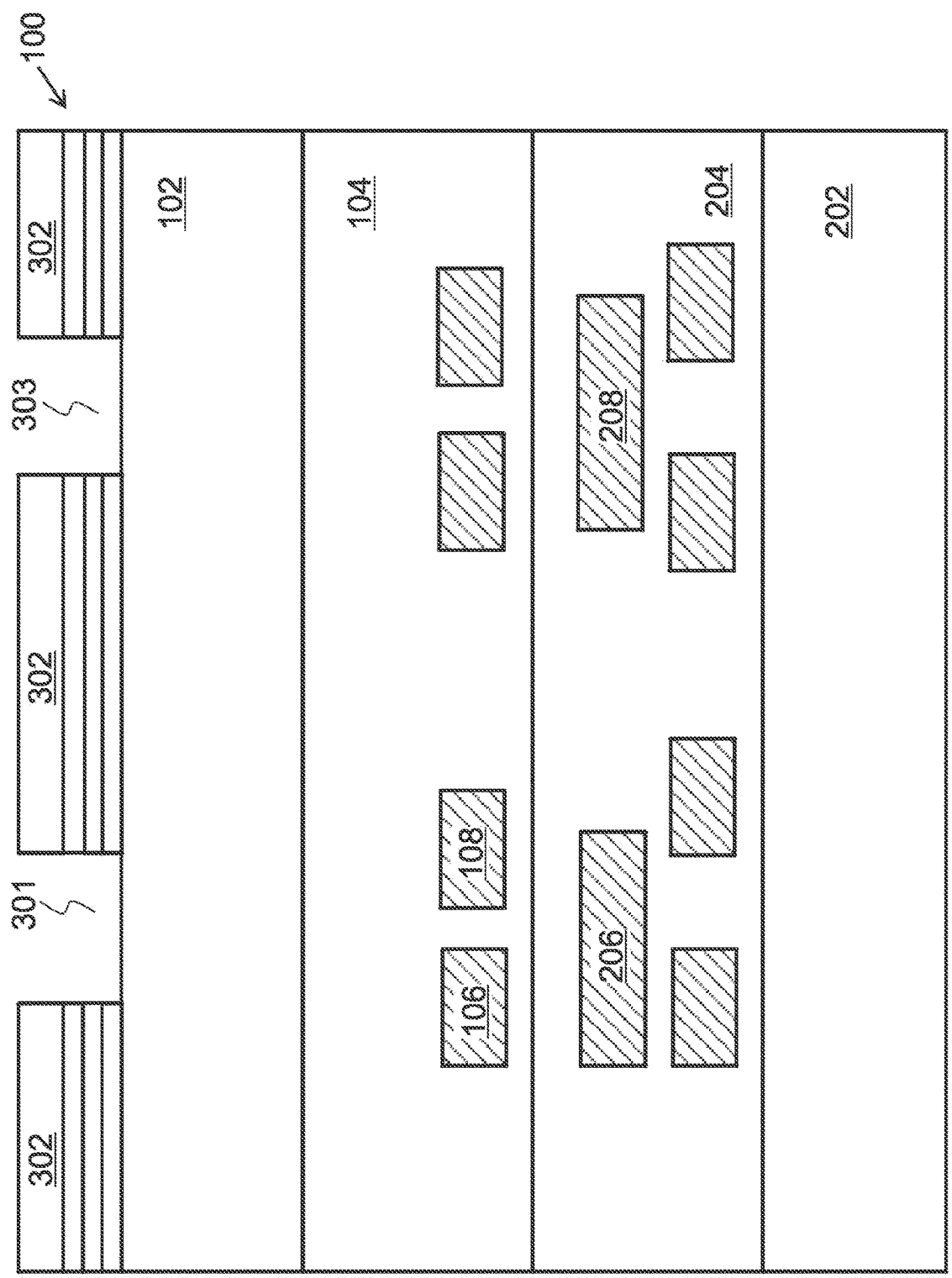
FIG. 3 illustrates a cross sectional view of the semiconductor device shown in FIG. 2 after a patterning process is applied to the hard mask layers and the BARC layer of the first semiconductor wafer in accordance with various embodiments of the present disclosure.

FIG. 3 illustrates a cross sectional view of the semiconductor device shown in FIG. 2 after a patterning process is applied to the hard mask layers and the BARC layer of the first semiconductor wafer in accordance with various embodiments of the present disclosure. A patterned mask 302 such as a photoresist mask and/or the like may be formed over the oxide hard mask layer 115 using suitable deposition and photolithography techniques. A suitable etching process, such as a reactive ion etch (RIE) or other dry etch, an anisotropic wet etch, or any other suitable anisotropic etch or patterning process may be applied to the hard mask layers and the BARC layer. As a result, a plurality of openings 301 and 303 are formed in the hard mask layers and the BARC layer.

After the openings 301 and 303 have been formed, the remaining photoresist layer (e.g., mask 302) may be removed by using suitable photoresist stripping techniques such as chemical solvent cleaning, plasma ashing, dry stripping and/or the like. The photoresist stripping techniques are well known and hence are not discussed in further detail herein to avoid repetition.

Figure 4:
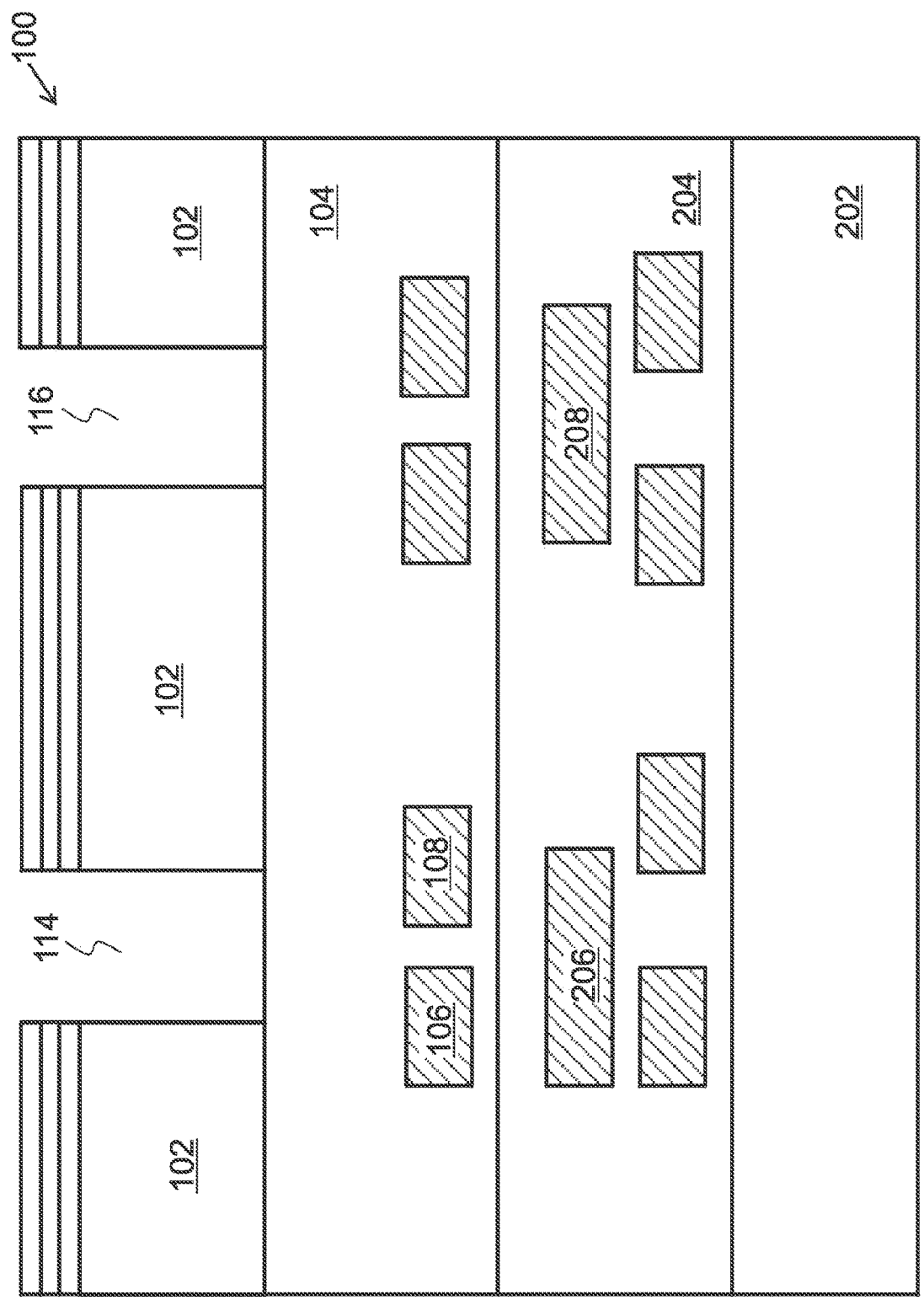
FIG. 4 illustrates a cross sectional view of the semiconductor device shown in FIG. 3 after an etching process is applied to the substrate of the first semiconductor wafer in accordance with various embodiments of the present disclosure.

FIG. 4 illustrates a cross sectional view of the semiconductor device shown in FIG. 3 after an etching process is applied to the substrate of the first semiconductor wafer in accordance with various embodiments of the present disclosure. After the photoresist mask has been removed by a suitable removal process, a suitable etching process, such as a dry etching, a wet etching or any other suitable patterning process may be applied to the first substrate 102 of the first semiconductor wafer 110. During the etching process, the oxide layer 115 may function as a hard mask layer. As shown in FIG. 4, a plurality of openings 114 and 116 are formed in the first substrate 102. The etching process may be performed on the first substrate 102 until the first inter-metal dielectric layer 104 is exposed. Subsequently, the oxide hard mask layer 115 may be removed by a suitable removal process.

Figure 5:
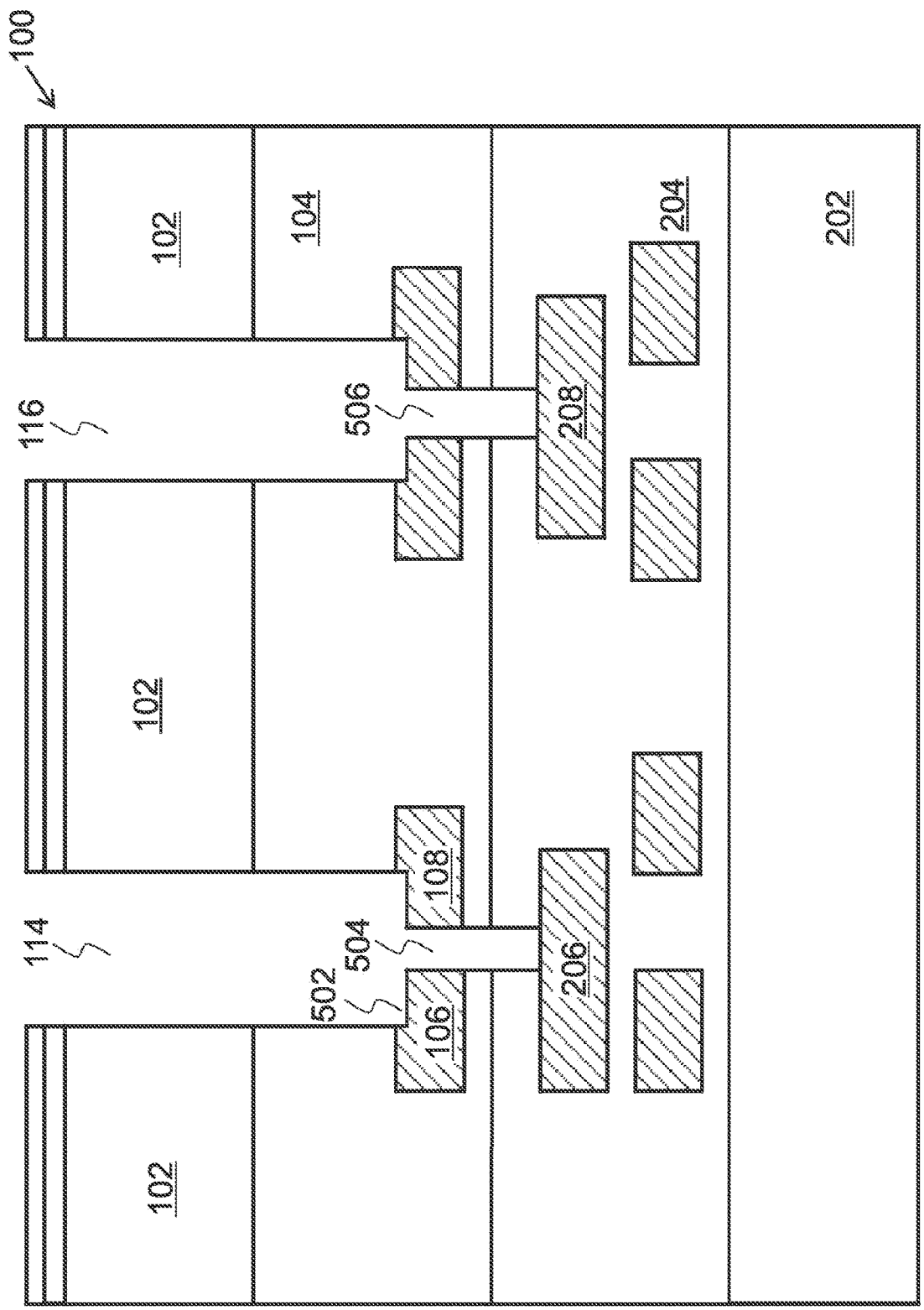
FIG. 5 illustrates a cross section view of the semiconductor device shown in FIG. 4 after another etching process is applied to the semiconductor device in accordance with various embodiments of the present disclosure.

FIG. 5 illustrates a cross section view of the semiconductor device shown in FIG. 4 after another etching process is applied to the semiconductor device in accordance with various embodiments of the present disclosure. A suitable etching process, such as a dry etch, an anisotropic wet etch, or any other suitable anisotropic etch or patterning process, may be performed on the semiconductor device to form openings 504 and 506. During the etching process, the poly layer 113 and the metal lines 106, 108 and 206 may function as hard mask layers.

The openings 504 and 506 are respective extensions of the openings 114 and 116 shown in FIG. 4. In particular, the openings 504 and 506 extend through the inter-metal dielectric layers 104 and 204 as well as the bonding interface of two stacked wafers. As shown in FIG. 5, the metal lines 106, 108, 206 and 208 are exposed after the openings 504 and 506 have been formed.

It should further be noted that the metal lines 106 and 108 are formed of suitable metal materials such as copper, which is of a different etching rate (selectivity) from the inter-metal dielectric layers (e.g., the inter-metal dielectric layers 104 and 204). As such, the metal lines 106 and 108 may function as a hard mask layer for the etching process of the inter-metal dielectric layers 104 and 204. A selective etching process may be employed to etch the inter-metal dielectric layers 104 and 204 rapidly while etching only a portion of the metal lines 106 and 108. As shown in FIG. 5, the exposed portion of the hard mask layer (e.g., metal lines 106 and 108) may be partially etched away, thereby forming a recess such as the recess 502 as shown in FIG. 5. The depth of the recess 502 may vary depending on a variety of applications and design needs.

Figure 6:
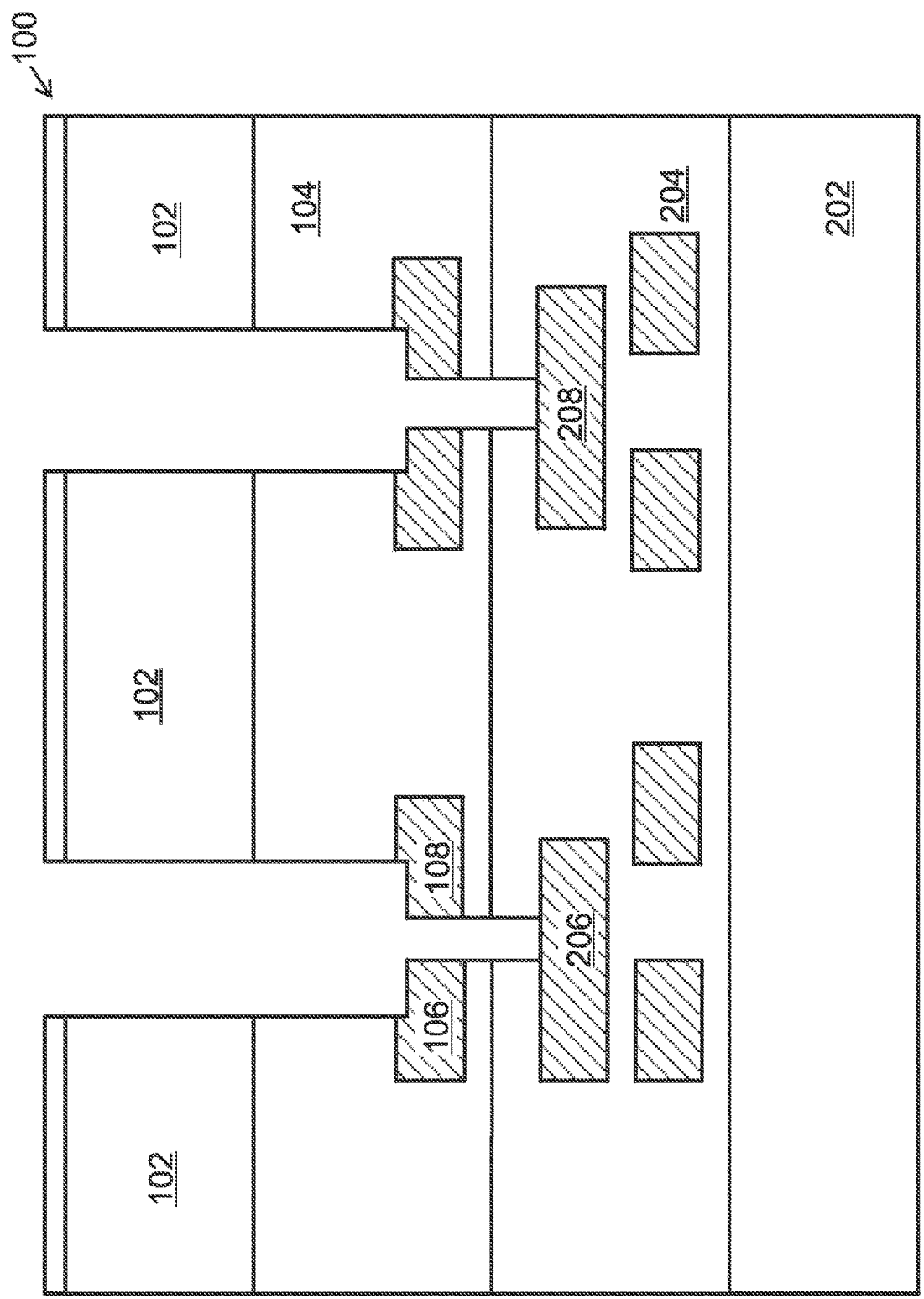
FIG. 6 illustrates a cross sectional view of the semiconductor device shown in FIG. 5 after the remaining photoresist layer has been removed in accordance with various embodiments of the present disclosure.

FIG. 6 illustrates a cross sectional view of the semiconductor device shown in FIG. 5 after the remaining poly layer has been removed in accordance with various embodiments of the present disclosure. During the etching process shown in FIG. 5, the poly layer 113 may be partially etched away or fully etched away. After the etching process, a suitable removal process may be employed to remove the remaining portion of the poly layer 113. As shown in FIG. 6, the top surface of the BARC layer 112 is exposed after the poly layer 113 has been removed.

Figure 7:
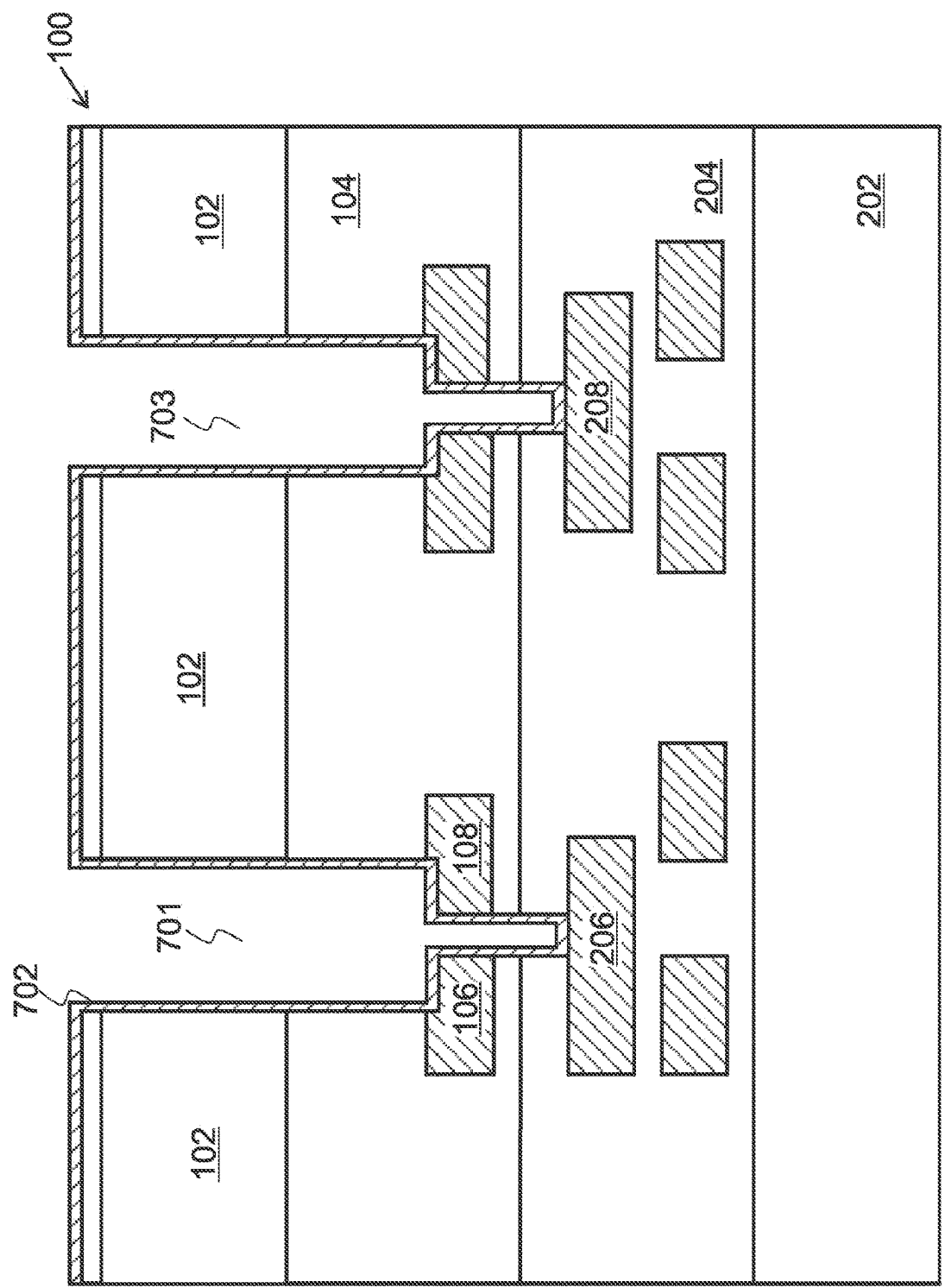
FIG. 7 illustrates a cross section view of the semiconductor device shown in FIG. 6 after a dielectric layer is deposited over the semiconductor device in accordance with various embodiments of the present disclosure.

FIG. 7 illustrates a cross section view of the semiconductor device shown in FIG. 6 after a dielectric layer is deposited over the semiconductor device in accordance with various embodiments of the present disclosure. As shown in FIG. 7, a dielectric layer 702 is formed over the bottoms and sidewalls of the openings 701 and 703. Furthermore, the dielectric layer 702 is formed over the top surface of the semiconductor device as shown in FIG. 7.

The dielectric layer 702 may be formed of various dielectric materials commonly used in integrated circuit fabrication. For example, the dielectric layer 702 may be formed of silicon dioxide, silicon nitride or a doped glass layer such as boron silicate glass and the like. Alternatively, dielectric layer may be a layer of silicon nitride, a silicon oxynitride layer, a polyamide layer, a low dielectric constant insulator or the like. In addition, a combination of the foregoing dielectric materials may also be used to form the dielectric layer 702. In accordance with some embodiments, the dielectric layer 702 may be formed using suitable techniques such as sputtering, oxidation, CVD and/or the like.

Figure 8:
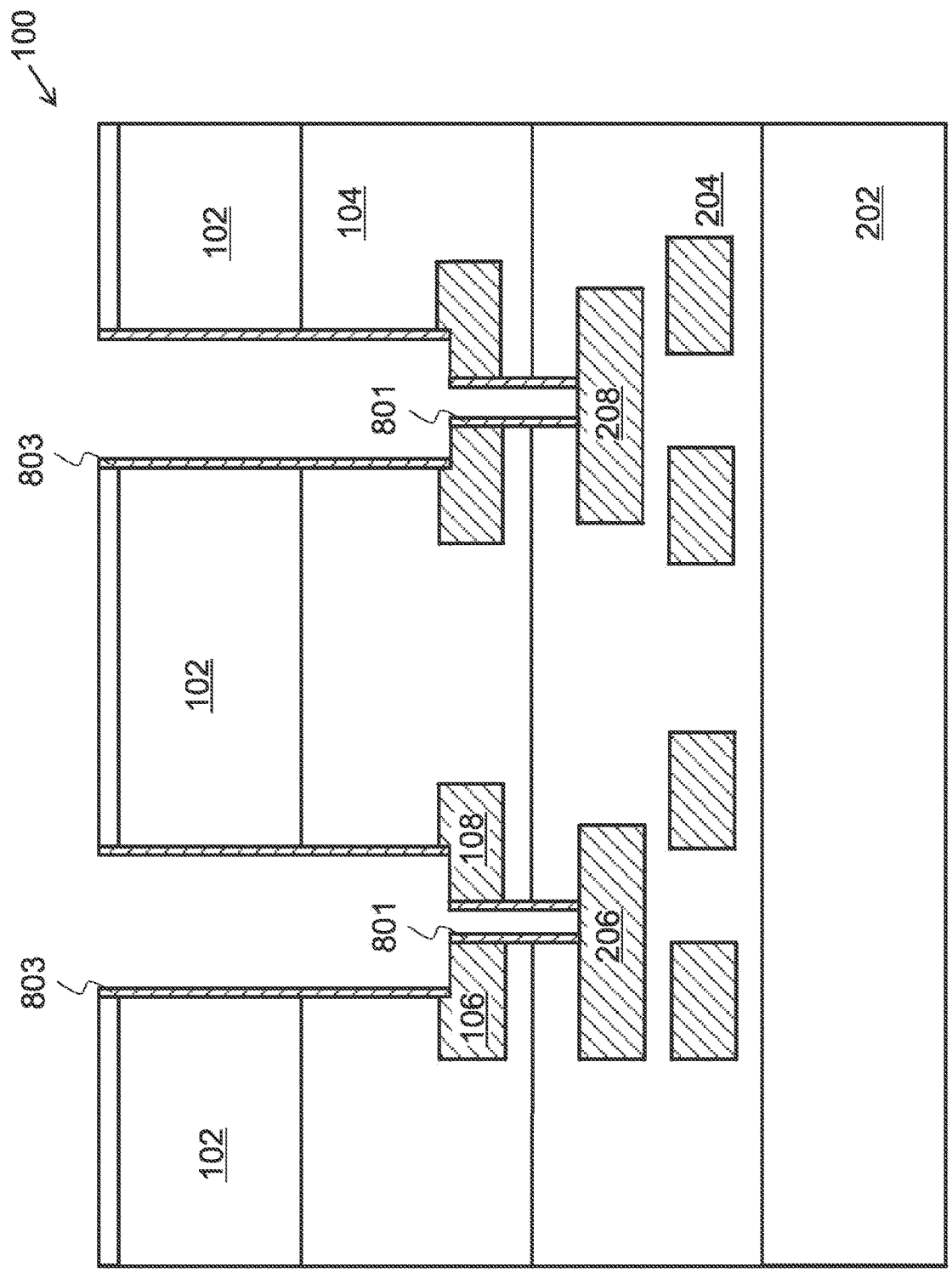
FIG. 8 illustrates a cross sectional view of the semiconductor device shown in FIG. 7 after an etching process is applied to some portions of the dielectric layer in accordance with in accordance with various embodiments of the present disclosure.

FIG. 8 illustrates a cross sectional view of the semiconductor device shown in FIG. 7 after an etching process is applied to some portions of the dielectric layer in accordance with in accordance with various embodiments of the present disclosure. The dielectric layer 702 may be patterned and portions of the dielectric layer 702 may be removed. As shown in FIG. 8, the remaining dielectric layer may include two portions. The first portion is formed along the sidewalls of the bottom trench. The second portion is formed along the sidewalls of the upper trench. Throughout the description, the first portion is alternatively referred to as a first dielectric layer 801. The second portion is alternatively referred to as a second dielectric layer 803.

The removal process of some portions of the dielectric layer 702 may be a suitable etching process such as wet-etching, dry-etching and/or the like. The detailed operations of either the dry etching process or the wet etching process are well known in the art, and hence are not discussed herein to avoid repetition.

Figure 9:
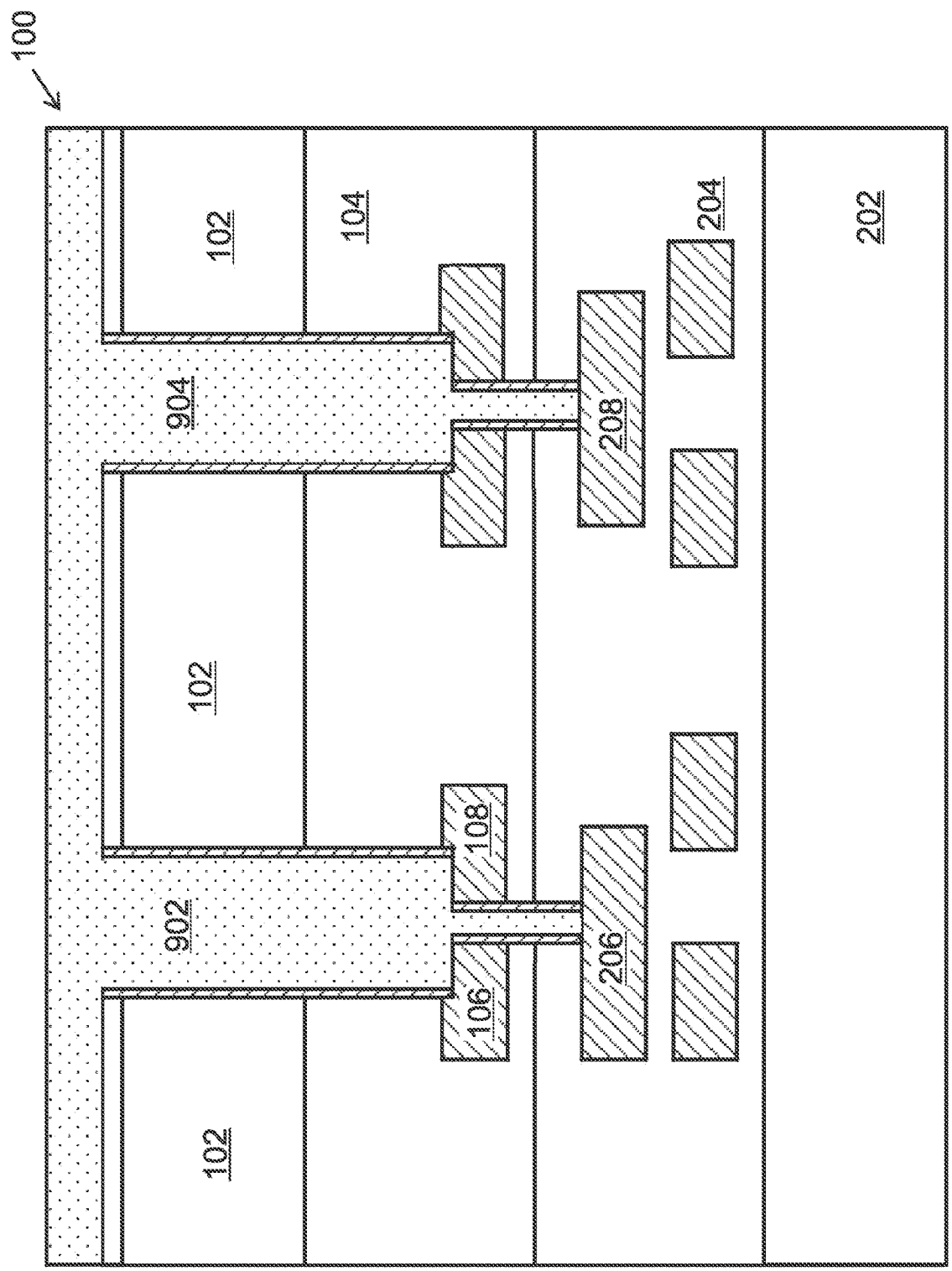
FIG. 9 illustrates a cross sectional view of the semiconductor device shown in FIG. 6 after a conductive material has been filled in the openings in accordance with various embodiments of the present disclosure.

FIG. 9 illustrates a cross sectional view of the semiconductor device shown in FIG. 8 after a conductive material has been filled in the openings in accordance with various embodiments of the present disclosure. In some embodiments, a plurality of auxiliary layers such as a seed layer may be deposited prior to a plating process, through which the conductive material is filled into the openings.

The seed layer (not shown) may be may be formed of copper, nickel, gold, any combination thereof and/or the like. The seed layer may be formed by suitable deposition techniques such as PVD, CVD and/or the like.

Once the seed layer has been deposited in the openings, a conductive material, which includes tungsten, titanium, aluminum, copper, any combinations thereof and/or the like, is filled into the openings, forming conductive plugs 902 and 904. In some embodiments, the conductive material may be filled in the openings through an electroplating process.

Figure 10:
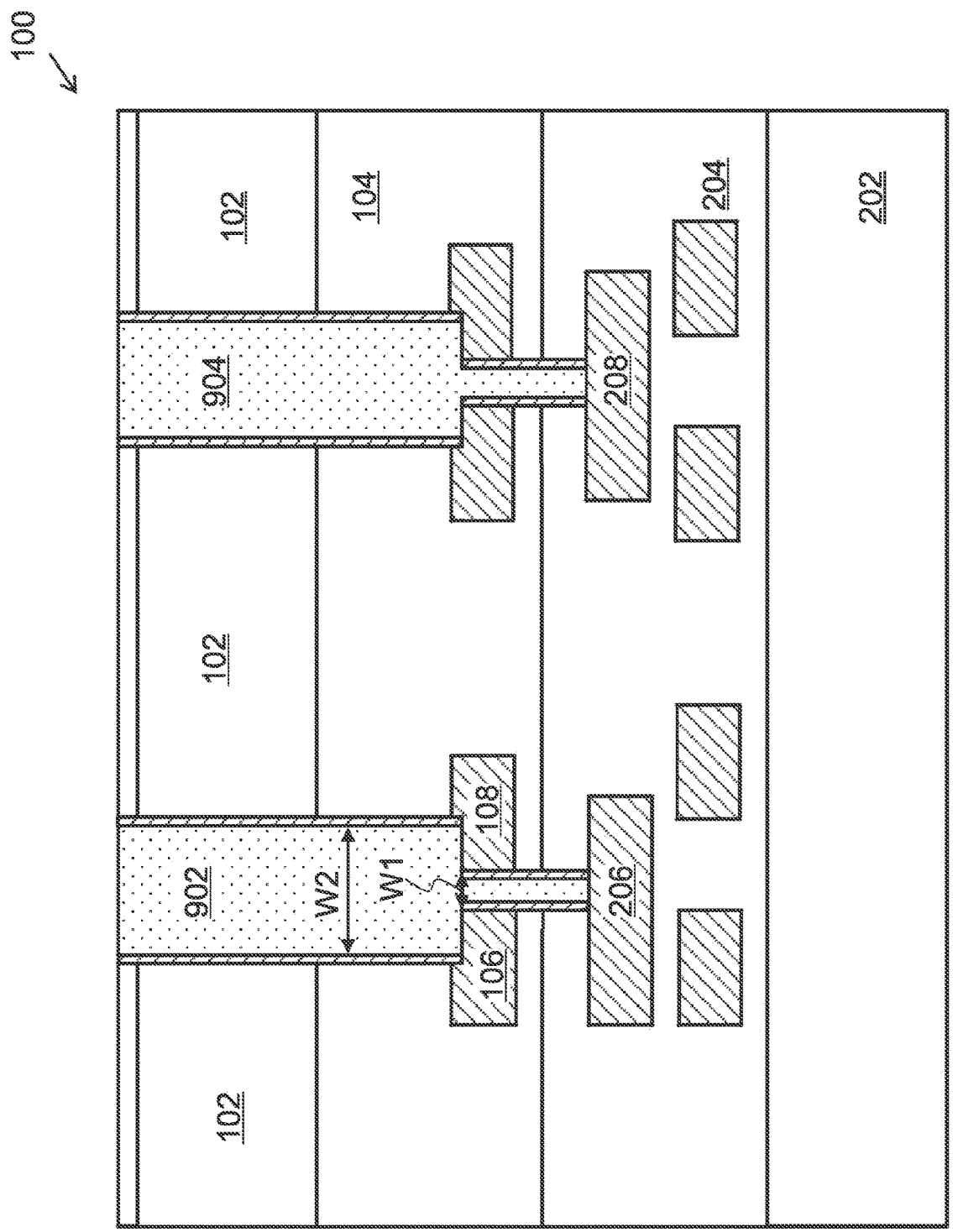
FIG. 10 illustrates a cross section view of the semiconductor device shown in FIG. 9 after a chemical mechanical polish (CMP) process is applied to the top surface of the semiconductor device in accordance with various embodiments of the present disclosure.

FIG. 10 illustrates a cross section view of the semiconductor device shown in FIG. 9 after a CMP process is applied to the top surface of the semiconductor device in accordance with various embodiments of the present disclosure. A planarization process, such as CMP, etch back step and the like, may be performed to planarize the top surface of the semiconductor device. As shown in FIG. 10, a portion of the conductive material has been removed as a result. As shown in FIG. 10, there may be two conductive plugs 902 and 904 formed in the semiconductor device after the CMP process is performed on the semiconductor device.

As shown in FIG. 10, each conductive plug (e.g., conductive plugs 902 and 904) may comprise two portions. A first portion is from the metal line 206 to the hard mask layer formed by the metal lines 106 and 108. The first portion is of a width W1 as shown in FIG. 10. A second portion is from the hard mask layer to the backside of the first substrate 102. The second portion is of a width W2 as shown in FIG. 10. In some embodiments, W2 is greater than or equal to W1.

Figure 11:
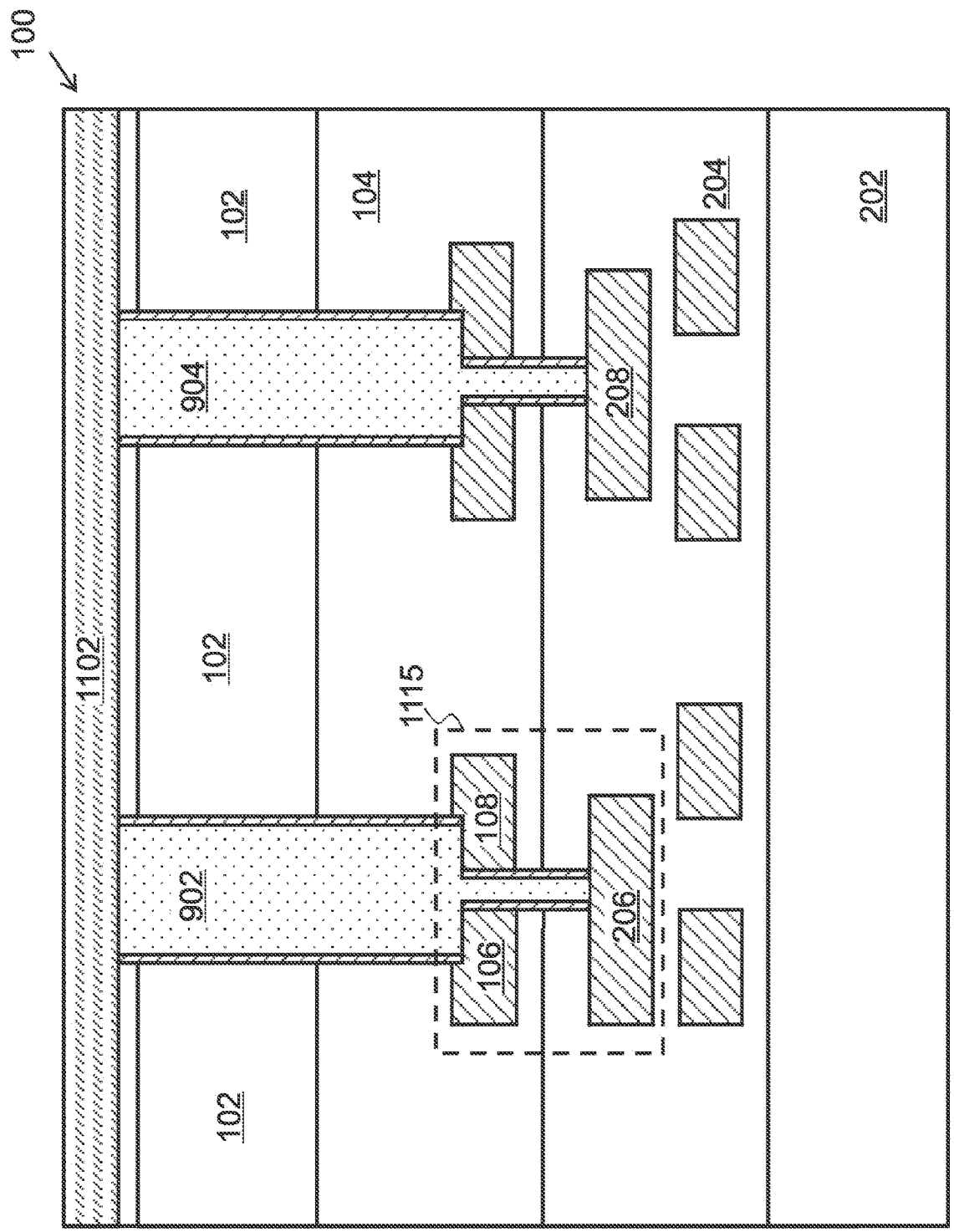
FIG. 11 illustrates a cross sectional view of the semiconductor device shown in FIG. 10 after a dielectric layer is formed on the semiconductor device in accordance with various embodiments of the present disclosure.

FIG. 11 illustrates a cross sectional view of the semiconductor device shown in FIG. 10 after a dielectric layer is formed on the semiconductor device in accordance with various embodiments of the present disclosure. The dielectric layer 1102 may comprise commonly used dielectric materials, such as silicon nitride, silicon oxynitride, silicon oxycarbide, silicon carbide, combinations thereof, and multi-layers thereof. The dielectric layer 1102 may be deposited over the semiconductor device through suitable deposition techniques such as sputtering, CVD and the like.

The conductive plugs (e.g., conductive plug 902) include two portions as described above with respect to FIG. 10. The portion from the hard mask layer (e.g., metal line 106) to the metal line 206 may be alternatively referred to as a three-dimensional structure 1115 throughout the description.

One advantageous feature of the stacked wafer having the conductive plugs 902 and 904 shown in FIG. 11 is that the active circuits of both semiconductor wafers are connected to each other through a single conductive plug (e.g., conductive plug 902). Such a single conductive plug helps to further reduce form factor. Furthermore, in comparison to stacked semiconductor devices connected by multiple conductive plugs, the single conductive plug coupled between two semiconductor wafers shown in FIG. 11 helps to cut power consumption and prevent parasitic interference.

It should be noted while FIG. 11 illustrates two semiconductor wafers stacked together, one skilled in the art will recognize that the stacked semiconductor device shown in FIG. 11 is merely an example. There may be many alternatives, variations and modifications. For example, the stacked semiconductor device may accommodate more than two semiconductor wafers.

Figure 12:
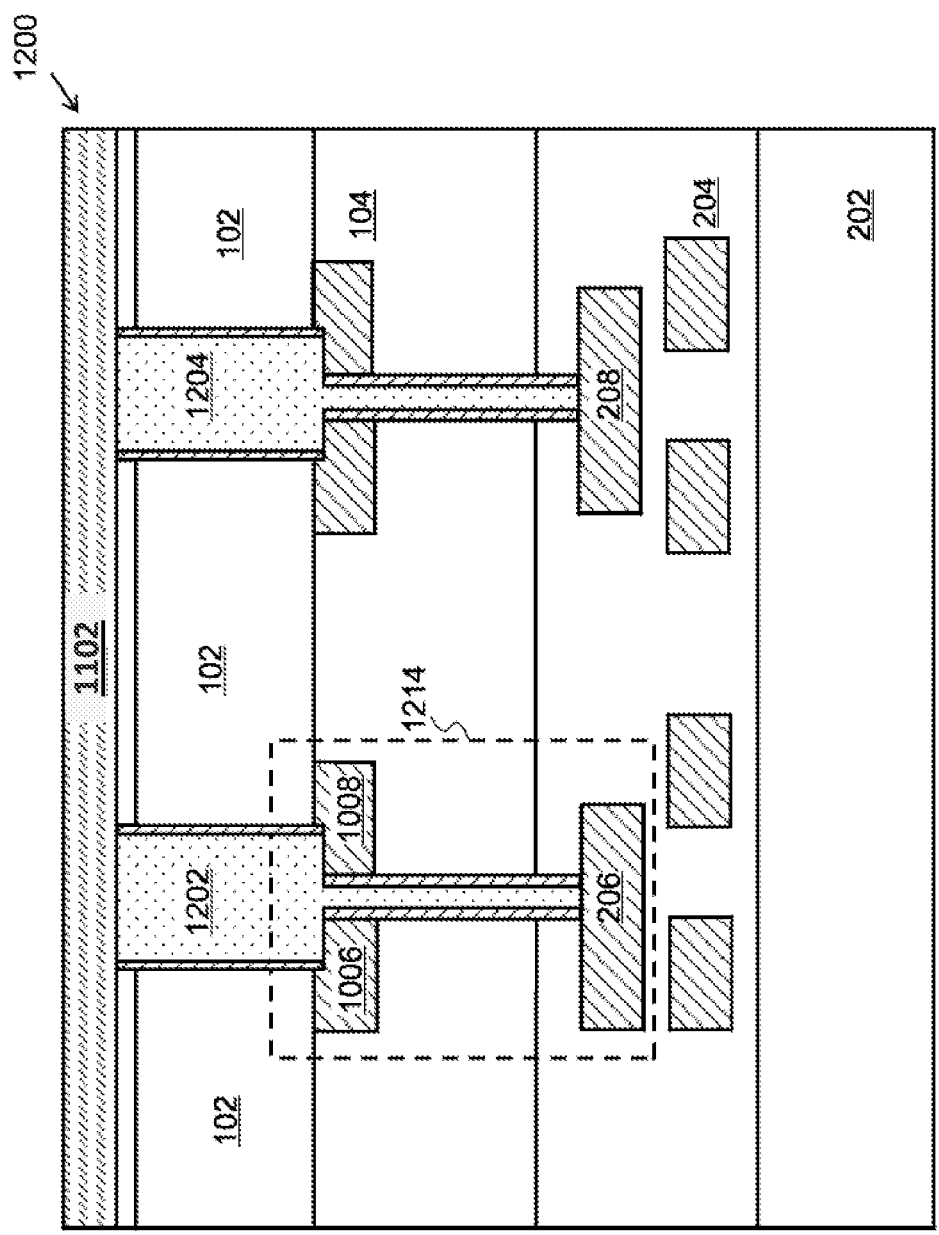
FIG. 12 illustrates a cross sectional view of another stacked semiconductor device in accordance with various embodiments of the present disclosure.

FIG. 12 illustrates a cross sectional view of another stacked semiconductor device in accordance with various embodiments of the present disclosure. The stacked semiconductor device 1200 is similar to the stacked semiconductor device 100 shown in FIG. 11 except that the hard mask layer is formed by contacts, which is located adjacent to the interface between the first substrate 102 and the inter-metal dielectric layers 104.

The contacts may be formed in an inter-layer dielectric layer (not shown). The inter-layer dielectric layer may comprise a material such as boron phosphorous silicate glass (BPSG), although any suitable dielectrics may be used for either layer. The inter-layer dielectric layer may be formed using a process such as PECVD, although other processes may alternatively be used.

The contacts 1006 and 1008 may be formed through the inter-layer dielectric layer with suitable photolithography and etching techniques. Generally, these photolithography techniques involve depositing a photoresist material, which is masked, exposed, and developed to expose portions of the inter-layer dielectric layer that are to be removed. The remaining photoresist material protects the underlying material from subsequent processing steps, such as etching.

The contacts 1006 and 1008 may comprise a barrier/adhesion layer (not shown) to prevent diffusion and provide better adhesion for the contacts 1006 and 1008. In some embodiments, the contacts 1006 and 1008 may be formed of any suitable conductive material, such as a highly-conductive, low-resistive metal, elemental metal, transition metal, or the like. In accordance with an embodiment, the contacts 1006 and 1008 are formed of tungsten, although other materials, such as copper, aluminum and/or the like, could alternatively be utilized. In an embodiment in which the contacts 1006 and 1008 are formed of tungsten, the contacts 1006 and 1008 may be deposited by CVD techniques known in the art, although any method of formation could alternatively be used.

As shown in FIG. 12, the conductive plugs (e.g., conductive plugs 1202 and 1204) include two portions. The portion from the hard mask layer (e.g., contact 1006) to the metal line 206 may be alternatively referred to as a three-dimensional structure 1214 throughout the description.

Figure 13:
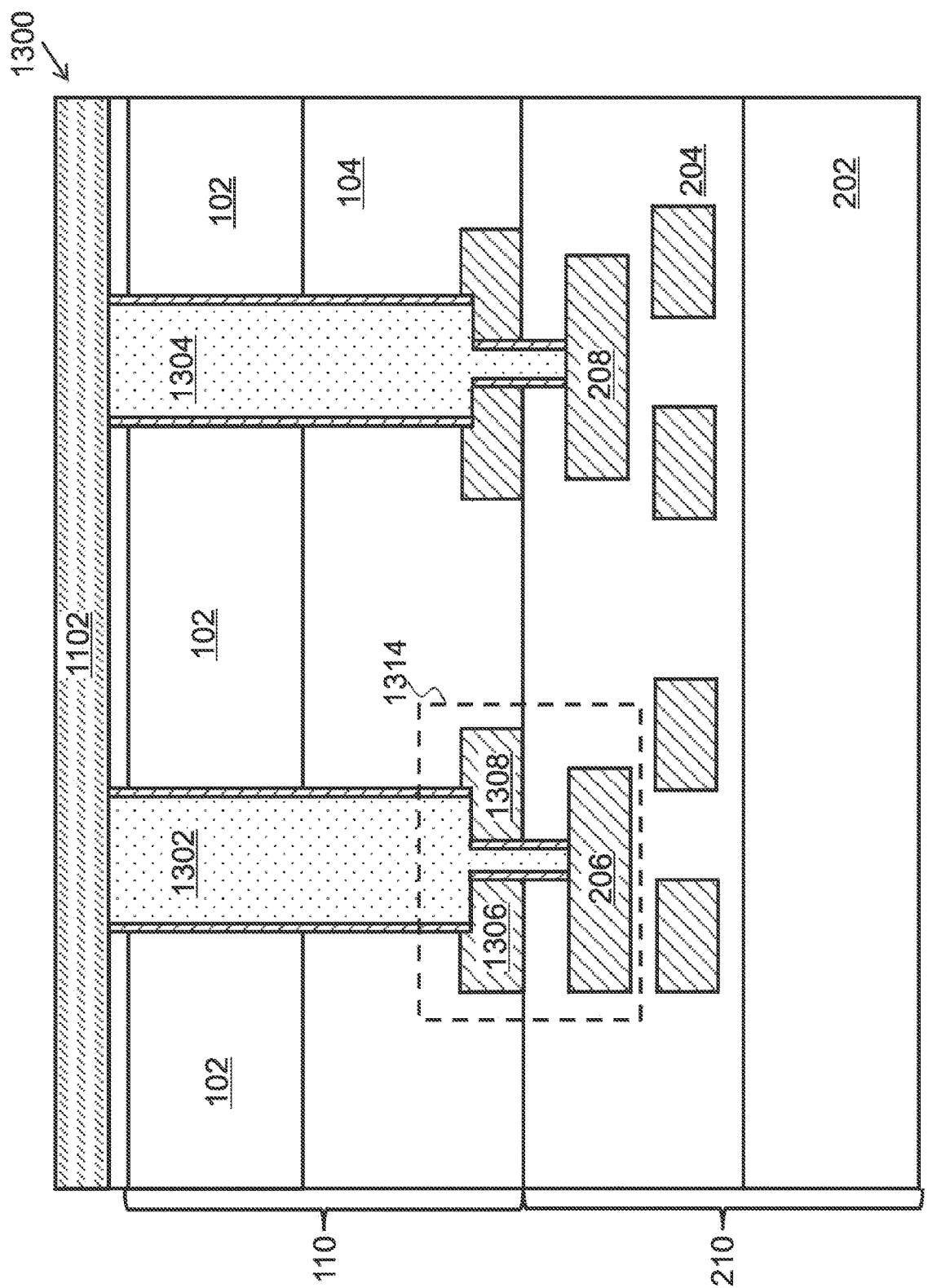
FIG. 13 illustrates a cross sectional view of yet another stacked semiconductor device in accordance with various embodiments of the present disclosure.

FIG. 13 illustrates a cross sectional view of yet another stacked semiconductor device in accordance with various embodiments of the present disclosure. The stacked semiconductor device 1300 is similar to the stacked semiconductor device 100 shown in FIG. 11 except that the etching hard mask is formed by redistribution lines, which are located adjacent to the interface of two semiconductor wafers.

The redistribution lines 1306 and 1308 may be a single material layer, or a multi-layered structure and may be made of metals such as titanium, titanium nitride, aluminum, tantalum, copper and combinations thereof. The redistribution lines 1306 and 1308 may be made by any suitable method known in the art such as physical vapor deposition (PVD), sputter, CVD, electroplating and/or the like.

The conductive plugs (e.g., conductive plugs 1302 and 1304) include two portions. The portion from the hard mask layer (e.g., redistribution lines 1306 and 1308) to the metal line 206 may be alternatively referred to as a three-dimensional structure 1314 throughout the description.

It should be noted that the first semiconductor wafer 110 may be bonded on the second wafer 210 through a suitable metal-dielectric bonding technique such as a copper-silicon oxide nitride (Cu—SiON) bonding process.

It should further be noted while FIG. 11, FIG. 12 and FIG. 13 illustrate hard mask layers formed by metal lines, contacts and redistribution lines respectively, one skilled in the art will recognize that hard mask layers shown in FIGS. 11-13 are merely examples. There may be many alternatives, variations and modifications. For example, the hard mask layer may be formed by a plurality of isolation regions, poly-silicon regions, any combinations thereof and/or the like.

Figure 14:
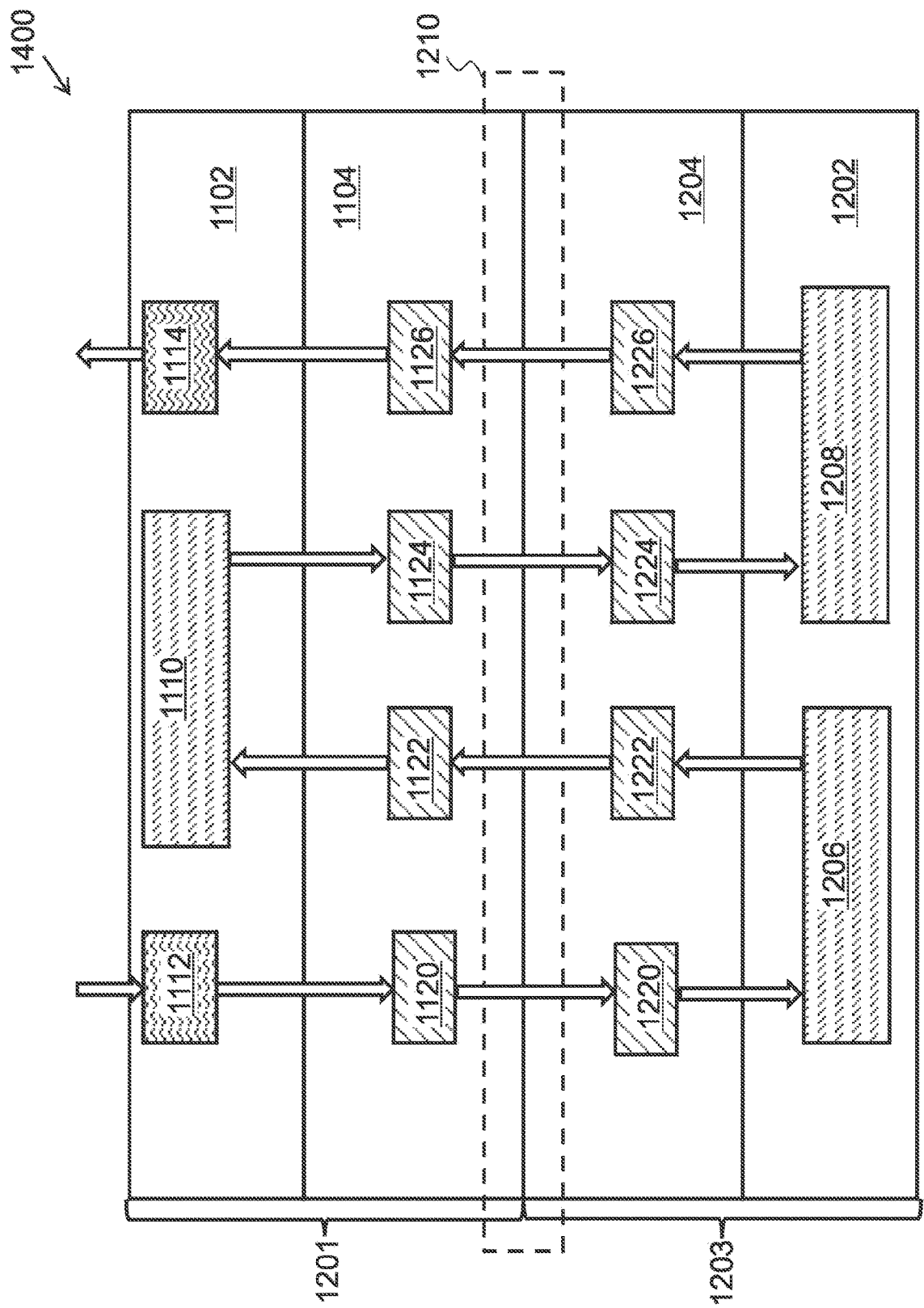
FIG. 14 illustrates a cross sectional view of a backside illuminated imager sensor including a stacked wafer structure in accordance with various embodiments of the present disclosure.

FIG. 14 illustrates a cross sectional view of a backside illuminated imager sensor including a stacked wafer structure in accordance with various embodiments of the present disclosure. The backside illuminated image sensor 1400 comprises two semiconductor wafers, namely a sensor wafer 1201 and an application-specific integrated circuit (ASIC) wafer 1203. As shown in FIG. 14, the sensor wafer 1201 is stacked on top of the ASIC 1203. In some embodiments, the sensor wafer 1201 and the ASIC wafer 1203 are connected to each other through suitable three-dimensional structures such as the three-dimensional structure 1115 shown in FIG. 11, the three-dimensional structure 1214 shown in FIG. 12, the three-dimensional structure 1314 shown in FIG. 13 and any combinations thereof.

The ASIC wafer 1203 may comprise a plurality of logic circuits such as logic circuits 1206 and 1208. In some embodiments, the logic circuits may be an analog-to-digital converter. However, the logic circuits may be other functional circuits that may be utilized within a backside illuminated image sensor. For example, the logic circuits 1206 and 1208 may be a data processing circuit, a memory circuit, a bias circuit, a reference circuit, any combinations thereof and/or the like.

The ASIC wafer 1203 may further comprise a plurality of interconnection layers and a plurality of metal lines 1220, 1222, 1224 and 1226 embedded in the interconnection layers. The metal lines 1220, 1222, 1224 and 1226 may function as interconnection structures. As indicated by the arrows shown in FIG. 14, the metal lines 1220, 1222, 1224 and 1226 provide signal paths between logic circuits 1206 and 1208, and the sensor wafer 1201.

The metal lines 1220, 1222, 1224 and 1226 may be made through any suitable formation process (e.g., lithography with etching, damascene, dual damascene, or the like) and may be formed using suitable conductive materials such as copper, aluminum, aluminum alloys, copper alloys or the like.

The sensor wafer 1201 is fabricated by CMOS process techniques known in the art. In particular, the sensor wafer 1201 comprises an epitaxial layer over a silicon substrate. According to the fabrication process of backside illuminated image sensors, the silicon substrate has been removed in a backside thinning process until the epitaxial layer is exposed. A portion of epitaxial layer may remain. A p-type photo active region and an n-type photo active region (not shown respectively) are formed in the remaining epitaxial layer.

The photo active regions such as the p-type photo active region and the n-type photo active region may form a PN junction, which functions as a photodiode. As shown in FIG. 14, the imager sensor 1110 may comprise a plurality of photodiodes.

The sensor wafer 1201 may comprise a transistor (not shown). In particular, the transistor may generate a signal related to the intensity or brightness of light that impinges on the photo active regions. In accordance with an embodiment, the transistor may be a transfer transistor. However, the transistor may be an example of the many types of functional transistors that may be utilized within a backside illuminated image sensor. For example, the transistor may include other transistors located within a backside illuminated image sensor, such as a reset transistor, a source follower transistor or a select transistor. All suitable transistors and configurations that may be utilized in an image sensor are fully intended to be included within the scope of the embodiments.

The sensor wafer 1201 may comprise a plurality of interconnection layers and metal lines embedded in the interconnection layers. The metal lines 1120, 1122, 1124 and 1126 may provide signal paths between the sensor wafer 1201 and the ASIC wafer 1203. In particular, as indicated by the arrows shown in FIG. 14, an external signal may enter the backside illuminated image sensor 1400 through the aluminum copper pad 1112, and then reach the metal routing (e.g., metal line 1120) through interconnect structures such through vias (not shown). The external signal may further pass through a three-dimensional structure 1210. The three-dimensional structure 1210 may be the three-dimensional structure 1115 shown in FIG. 11, the three-dimensional structure 1214 shown in FIG. 11, the three-dimensional structure 1314 shown in FIG. 13 and/or any combinations thereof.

After the external signal passes the three-dimensional structure 1210, the external signal may reach the logic circuit 1206 through the metal routing (e.g., metal line 1220) of the ASIC wafer 1203.

When a signal leaves the logic circuit 1206, it reaches the image sensor 1110 through a conductive path formed by the metal routing (e.g., metal line 1222) of the ASIC wafer 1203, the three-dimensional structure 1210, the metal routing (e.g., metal line 1122) of the sensor wafer 1201.

After the image sensor 1110 generates a signal, the signal is sent to the logic circuit 1208 through a path formed by the metal routing (e.g., metal line 1124) of the sensor wafer 1201, the three-dimensional structure 1210, the metal routing (e.g., metal line 1224) of the ASIC wafer 1203. Furthermore, the signal may be sent outside of the backside illuminated image sensor 1400 from the logic circuit 1208 through a path formed by the metal routing (e.g., metal line 1226) of the ASIC wafer 1203, the three-dimensional structure 1210, the metal routing (e.g., metal line 1126) of the sensor wafer 1201 and the aluminum copper pad 1114.

The logic circuit 1206 and 1208 may be coupled to aluminum copper pads 1112 and 1114. As shown in FIG. 14, the aluminum copper pads 1112 and 1114 may be formed on the backside of the sensor wafer 1201.

It should be noted that the location of the aluminum copper pads 1112 and 1114 shown in FIG. 14 is merely an example. A person skilled in the art will recognize that there may be many alternatives, modifications and variations. For example, the aluminum copper pads 1112 and 1114 may be formed on the non-bonding side of the ASIC wafer 1203. The form factor of a backside illuminated image sensor can be reduced by forming the aluminum copper pads 1112 and 1114 on the non-bonding side of the ASIC wafer 1203.

One advantageous feature of having input/output terminals formed on the non-bonding side of the ASIC wafer 1203 is that the density as well as quantum efficiency of the backside illuminated image sensor 1400 can be improved as a result.

Figure 15:
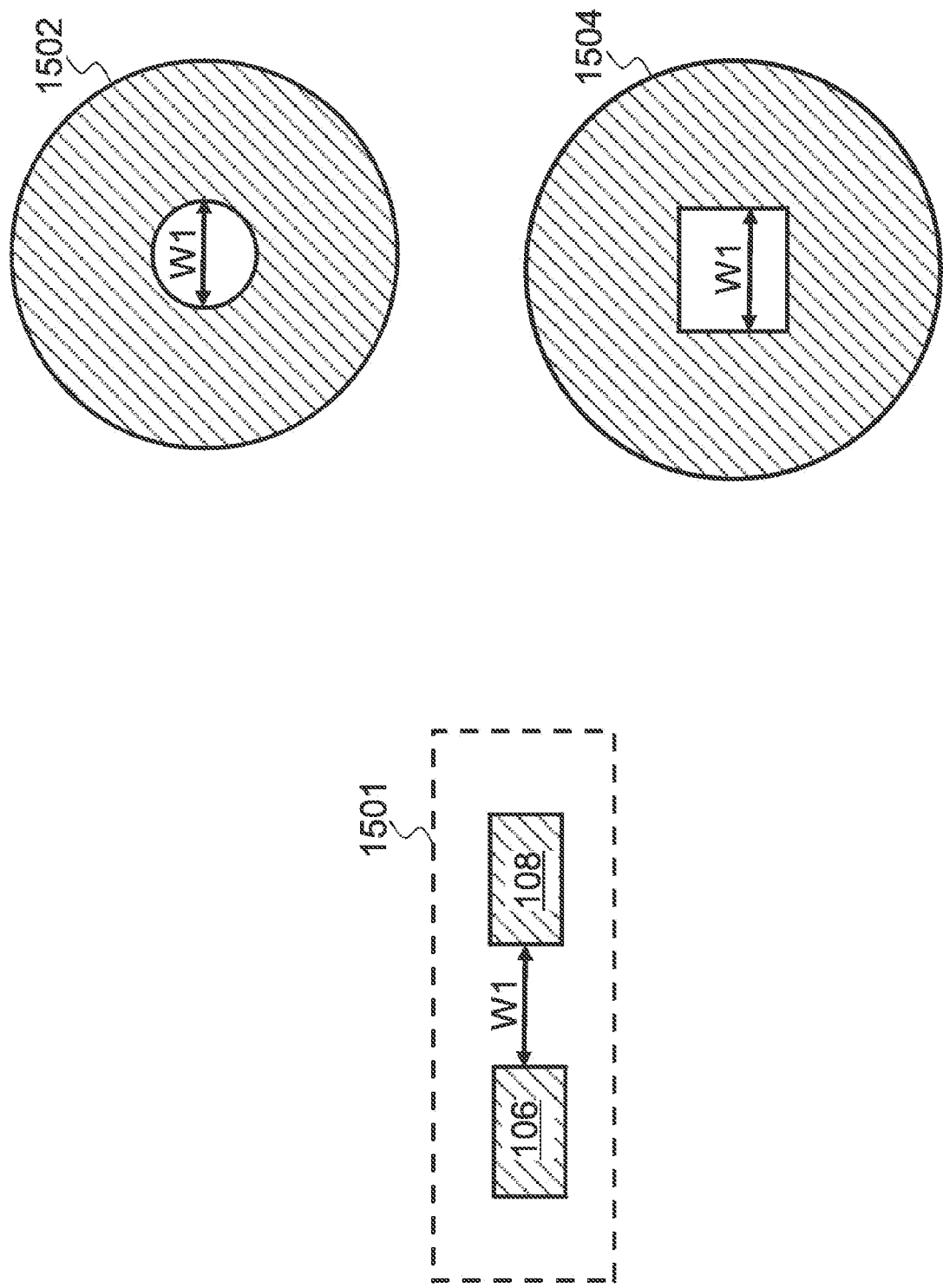
FIG. 15 illustrates a top view of the hard mask in accordance with various embodiments of the present disclosure.

FIG. 15 illustrates a top view of the hard mask in accordance with various embodiments of the present disclosure. As described above with respect to FIG. 11, FIG. 12 and FIG. 13, the hard mask layers may be formed by metal lines, contacts and redistribution lines respectively. While the cross sectional view 1501 shows the hard mask layer includes two portions (e.g., metal lines 106 and 108), these two portions may be from a continuous ring shaped region as illustrated by the top view 1502. The top view 1502 of the hard mask layer shows the hard mask layer is of a ring shape. The inside diameter of the ring shaped hard mask layer is denoted as W1.

It should be noted that the internal circle of the ring shaped hard mask layer can be replaced by other suitable shapes such as a square as shown by the top view 1504. It is within the scope and spirit of various embodiments of the present disclosure that the top view of the hard mask layer may comprise other shapes, such as, but no limited to oval, triangular, polygonal and/or the like.

FIG. 16 illustrates another top view of the hard mask in accordance with various embodiments of the present disclosure. The top views of FIG. 16 are similar to those shown in FIG. 15 except that the ring shape is replaced by a square with an opening. The top view 1602 shows a square with a square shaped opening. The top view 1604 shows a square with a circular shaped opening.

In accordance with an embodiment, a method comprises bonding a first semiconductor chip on a second semiconductor chip, applying an etching process to the first semiconductor chip and the second semiconductor chip until a metal surface of the second semiconductor chip is exposed, wherein as a result of applying the etching process, an opening is formed in the first semiconductor chip and the second semiconductor chip and plating a conductive material in the opening to from a conductive plug.

In accordance with an embodiment, a method comprises bonding a first semiconductor chip on a second semiconductor chip, applying an etching process to the first semiconductor chip and the second semiconductor chip until a metal surface of the second semiconductor chip is exposed, forming an opening extending through the first semiconductor chip and partially through the second semiconductor chip, wherein a portion of the opening is surrounded by a conductive element of the first semiconductor chip, the portion comprising two different widths and plating a conductive material in the opening to from a conductive plug.

In accordance with an embodiment, a method comprises bonding a first semiconductor chip on a second semiconductor chip, wherein an interconnect structure of the first semiconductor chip is in contact with an interconnect structure of the second semiconductor chip, applying an etching process to the first semiconductor chip and the second semiconductor chip until an interconnect element of the second semiconductor chip is exposed, forming an opening extending through the first semiconductor chip and partially through the second semiconductor chip, wherein the opening extends into an interconnect element of the first semiconductor chip and plating a conductive material in the opening to from a conductive plug.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
bonding a first semiconductor chip on a second semiconductor chip;
depositing a first hard mask layer over the first semiconductor chip, wherein the first hard mask layer comprises polysilicon;
depositing a second hard mask layer over the first hard mask layer, wherein the second hard mask layer comprises an oxide;
performing a first etching process and a second etching process on the first semiconductor chip and the second semiconductor chip until a metal surface of the second semiconductor chip is exposed, the first etching process using the second hard mask layer as a mask and the second etching process using the first hard mask layer as a mask, wherein as a result of performing the first and the second etching process, an opening is formed in the first semiconductor chip, wherein the opening includes a first portion extending into a metal element of the first semiconductor chip and a second portion over the metal element; and
plating a conductive material in the opening to from a conductive plug.

2. The method of claim 1, wherein:
the opening includes a third portion extending through a common boundary of the first semiconductor chip and the second semiconductor chip and a fourth portion surrounded by the metal element of the first semiconductor chip.

3. The method of claim 2, wherein:
the metal element is a metal line of the first semiconductor chip; and
the metal surface of the second semiconductor chip is a surface of a metal line of the second semiconductor chip.

4. The method of claim 2, wherein:
a width of the third portion is substantially equal to a width of the fourth portion;
a width of the first portion is greater than the width of the fourth portion; and a width of the second portion is substantially equal to the width of the first portion.

5. The method of claim 2, further comprising:
depositing a first dielectric layer on bottoms and sidewalls of the opening; and
removing the first dielectric layer on a bottom of the third portion and a bottom of the first portion.

6. The method of claim 5, wherein:
as a result of performing the step of removing the first dielectric layer, the first dielectric layer becomes a discontinuous layer including a first sidewall portion and a second sidewall portion.

7. The method of claim 1, further comprising:
performing a chemical mechanical polish process until a topmost surface of the conductive plug is level a top surface of an anti-reflection coating layer.

8. The method of claim 7, further comprising:
after the step of performing the chemical mechanical polish process, forming a second dielectric layer over the conductive plug, wherein the topmost surface of the conductive plug is completely covered by the second dielectric layer.

9. The method of claim 1, wherein:
at least a portion of the conductive plug is surrounded by an anti-reflection coating layer.

10. A method comprising:
bonding a first semiconductor chip on a second semiconductor chip, wherein the first semiconductor chip includes a substrate and a plurality of inter-metal dielectric layers;
depositing a first hard mask layer over the first semiconductor chip, wherein the first hard mask layer comprises polysilicon;
depositing a second hard mask layer over the first hard mask layer, wherein the second hard mask layer comprises an oxide;
etching a first opening through the substrate using the second hard mask layer as a mask;
etching a second opening partially through the plurality of inter-metal dielectric layers using the first hard mask layer as a mask, wherein after etching the second opening, a metal surface of a conductive element of the first semiconductor chip is exposed;
etching the first semiconductor chip and the second semiconductor chip to form a third opening extending through the first semiconductor chip and partially through the second semiconductor chip, a portion of the third opening being surrounded by the conductive element of the first semiconductor chip, wherein after forming the third opening a metal surface of the second semiconductor chip is exposed, wherein a portion of the second opening extends into the conductive element of the first semiconductor chip; and
plating a conductive material in the first, second, and third openings to from a conductive plug.

11. The method of claim 10, wherein:
the first semiconductor chip and the second semiconductor chip are bonded together through a direct bonding process.

12. The method of claim 11, wherein:
during the direct bonding process, bonding pads of the first semiconductor chip are aligned face-to-face with respective bonding pads of the second semiconductor chip.

13. The method of claim 10, wherein:
a portion of the third opening extends through the conductive element of the first semiconductor chip.

14. The method of claim 13, wherein:
a width of the second opening is greater than a width of the third opening.

15. The method of claim 10, wherein:
at least a portion of the conductive plug protrudes over a backside of the first semiconductor chip.

16. A method comprising:
bonding a first semiconductor chip on a second semiconductor chip;
depositing a first hard mask layer over the first semiconductor chip, wherein the first hard mask layer comprises polysilicon;
depositing a second hard mask layer over the first hard mask layer, wherein the second hard mask layer comprises an oxide;
performing a first and a second etching process on the first semiconductor chip until an interconnect element of the first semiconductor chip is exposed, the first etching process using the second hard mask layer as a mask and the second etching process using the first hard mask layer as a mask, wherein as a result of performing the first and second etching process, a first opening is formed in the first semiconductor chip;
performing a third etching process on the first semiconductor chip and the second semiconductor chip until an interconnect element of the second semiconductor chip is exposed, the third etching process using the interconnect element of the first semiconductor chip as a mask, the third etching process resulting in a second opening being formed in the first semiconductor chip and the second semiconductor chip, wherein a portion of the first opening extends into the interconnect element of the first semiconductor chip; and
plating a conductive material in the first and second openings to from a conductive plug.

17. The method of claim 16, further comprising:
forming an anti-reflection coating layer over and in contact with a backside of the first semiconductor chip, wherein at least a portion of the conductive plug is surrounded by the anti-reflection coating layer.

18. The method of claim 16, wherein:
the interconnect element of the first semiconductor chip is a metal line.

19. The method of claim 16, wherein:
the interconnect element of the first semiconductor chip is a metal contact in contact with a substrate of the first semiconductor chip.

20. The method of claim 16, wherein:
the interconnect element of the first semiconductor chip is a redistribution line in contact with the second semiconductor chip.

* * * * *

UNITED STATES PATENT AND TRADEMARK OFFICE
CERTIFICATE OF CORRECTION

PATENT NO. : 10,763,292 B2  
APPLICATION NO. : 16/224300  
DATED : September 1, 2020  
INVENTOR(S) : Jeng-Shyan Lin Page 1 of 1

It is certified that error appears in the above-identified patent and that said Letters Patent is hereby corrected as shown below:

In the Claims

In Column 13, Line 15, Claim 7, delete "level a top" and insert --level with a top--.

Signed and Sealed this  
First Day of December, 2020

Andrei Iancu  
*Director of the United States Patent and Trademark Office*